United States Patent
Shimbayashi (10) Patent No.: US 7,239,576 B2
(45) Date of Patent: Jul. 3, 2007

(54) MEMORY DEVICE AND METHOD OF CONTROLLING THE SAME

(75) Inventor: Koji Shimbayashi, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/342,013

(22) Filed: Jan. 27, 2006

(65) Prior Publication Data
US 2006/0250884 A1 Nov. 9, 2006

Related U.S. Application Data

(63) Continuation of application No. PCT/JP2005/001094, filed on Jan. 27, 2005.

(51) Int. Cl.
*G11C 8/18* (2006.01)
(52) U.S. Cl. .................... 365/233.5; 365/233; 365/191
(58) Field of Classification Search ............ 365/233.5, 365/233, 191, 189.07, 230.06, 193
See application file for complete search history.

(56) References Cited

U.S. PATENT DOCUMENTS

| | | | |
|---|---|---|---|
| 5,892,730 A | 4/1999 | Sato et al. | |
| 6,151,236 A | 11/2000 | Bondurant et al. | |
| 6,151,271 A | 11/2000 | Lee | |
| 6,198,688 B1 * | 3/2001 | Choi | 365/233 |
| 6,337,832 B1 | 1/2002 | Ooishi et al. | |
| 6,947,334 B2 * | 9/2005 | Shin | 365/189.01 |
| 2002/0064072 A1 | 5/2002 | Ooishi et al. | |
| 2003/0103407 A1 | 6/2003 | Ooishi et al. | |
| 2004/0047220 A1 | 3/2004 | Itoh | |
| 2005/0117446 A1 | 6/2005 | Shimbayashi | |

FOREIGN PATENT DOCUMENTS

| | | |
|---|---|---|
| JP | 10-334659 | 12/1998 |
| JP | 11-213668 | 8/1999 |
| JP | 2000-067577 | 3/2000 |
| JP | 2000-353382 | 12/2000 |
| JP | 2001-283587 | 10/2001 |
| JP | 2002-152052 | 5/2002 |
| JP | 2003-059298 | 2/2003 |
| JP | 2004-103061 | 4/2004 |
| JP | 2004-145999 | 5/2004 |
| JP | 2004-206832 | 7/2004 |

\* cited by examiner

*Primary Examiner*—Anh Phung
*Assistant Examiner*—Dang Nguyen
(74) *Attorney, Agent, or Firm*—Ingrassia Fisher & Lorenz, P.C.

(57) ABSTRACT

In a single data rate (SDR) mode, logic level transitions of a data condition prior-determination signal RDYO are outputted to an output terminal (O) in response to an internal clock signal CKI. A ready signal RDY is outputted in synchronization with the internal clock signal CKI following a logic level transition of the data condition prior-determination signal RDYO. In a double data rate (DDR) mode, on the other hand, a toggle signal is outputted to the output terminal (O) in correspondence with the internal clock signal CKI following a logical level transition of the data condition prior-determination signal RDYO. After the internal clock signal CKI following the logical level transition of the data condition prior-determination signal RDYO, a strobe signal DQS is outputted in synchronization with the internal clock signal CKI. The ready signal RDY is outputted at the data condition informing terminal (X) in SDR mode while, on the other hand, the strobe signal DQS is outputted at the data condition informing terminal (X) in DDR mode.

24 Claims, 5 Drawing Sheets

MEMORY DEVICE AND METHOD OF CONTROLLING THE SAME

CROSS-REFERENCES TO RELATED APPLICATIONS

This is a continuation application of International Application No. PCT/JP2005/001094 filed Jan. 27, 2005, which was not published in English under PCT Article 21(2).

TECHNICAL FIELD

The present invention relates to a memory device able to operate selectively in a single data rate mode or in a double data rate mode, and to a method of controlling such type of memory device.

BACKGROUND

Background Art

During synchronous access operation, a typical memory device is able to perform an operation of sequentially reading out data items from different addresses for every clock signal cycle in a steady state. In order to enable the memory device to function that way, as a preprocessing step thereof, the internal processing of data to be read out (e.g., the amplification of data items from a plurality of memory cells) is required at the start of a reading-out operation. In order to obtain the time required to carry out such preprocessing, an initial latency is generally set for the purpose of measuring a predetermined length of time by counting clock signal cycles after activation.

After the initial latency has elapsed, the outputting of data in synchronization with the clock signal cycle is enabled. And, for the purpose of signaling this timing to a device exterior to the memory device, a flag with the indication of effectiveness of the data (hereinafter referred to as a data valid flag) may be outputted. This allows the external controller to verify that the output data from the memory device is genuine. Such type of data valid flag is generally outputted at a dedicated terminal (e.g., RDY terminal) of a non volatile memory device (e.g., flash memory). If an output signal from the RDY terminal is in a predetermined logic level state, this makes it possible for the controller to make a decision that a data item being outputted from the memory device is genuine.

The aforesaid synchronous access operation is generally a single data rate (hereinafter SDR) mode operation which is conducted in synchronization with one edge of a clock signal. On the other hand, there is a memory device of a type which is specified to operate in a double data rate (hereinafter DDR) mode in which a reading-out operation is conducted in synchronization with both edges of a clock signal. The frequency of clock signals is generally high and the data output frequency in the DDR mode is twice as high as the clock signal frequency. However, a controller in need of data from the memory device is not always disposed in close proximity to the memory device. The controller may possibly be connected, through a very long path interconnection, to the memory device. With respect to the transfer of data at a high speed, the controller may possibly fail to establish synchronization or to take a data download setup time and a hold time.

In view of the above circumstances, it is preferred that a strobe signal is outputted from the memory device in the DDR mode in synchronization with the timing of outputting data. The strobe signal is a signal which is toggled in synchronization with the data and is updated at a frequency twice as high as the clock signal frequency. The controller is then able to take in data in synchronization with the strobe signal. Typically, the strobe signal is outputted at a dedicated terminal such as a DQS terminal.

In recent years, memory devices which can be selectively operated in SDR mode or in DDR mode have been proposed. One such memory device is disclosed in Japanese unexamined patent publication No. H11(1999)-213668 ("Patent Document 1"). This technique requires the provision of both a RDY terminal and a DQS terminal.

Figure 7:
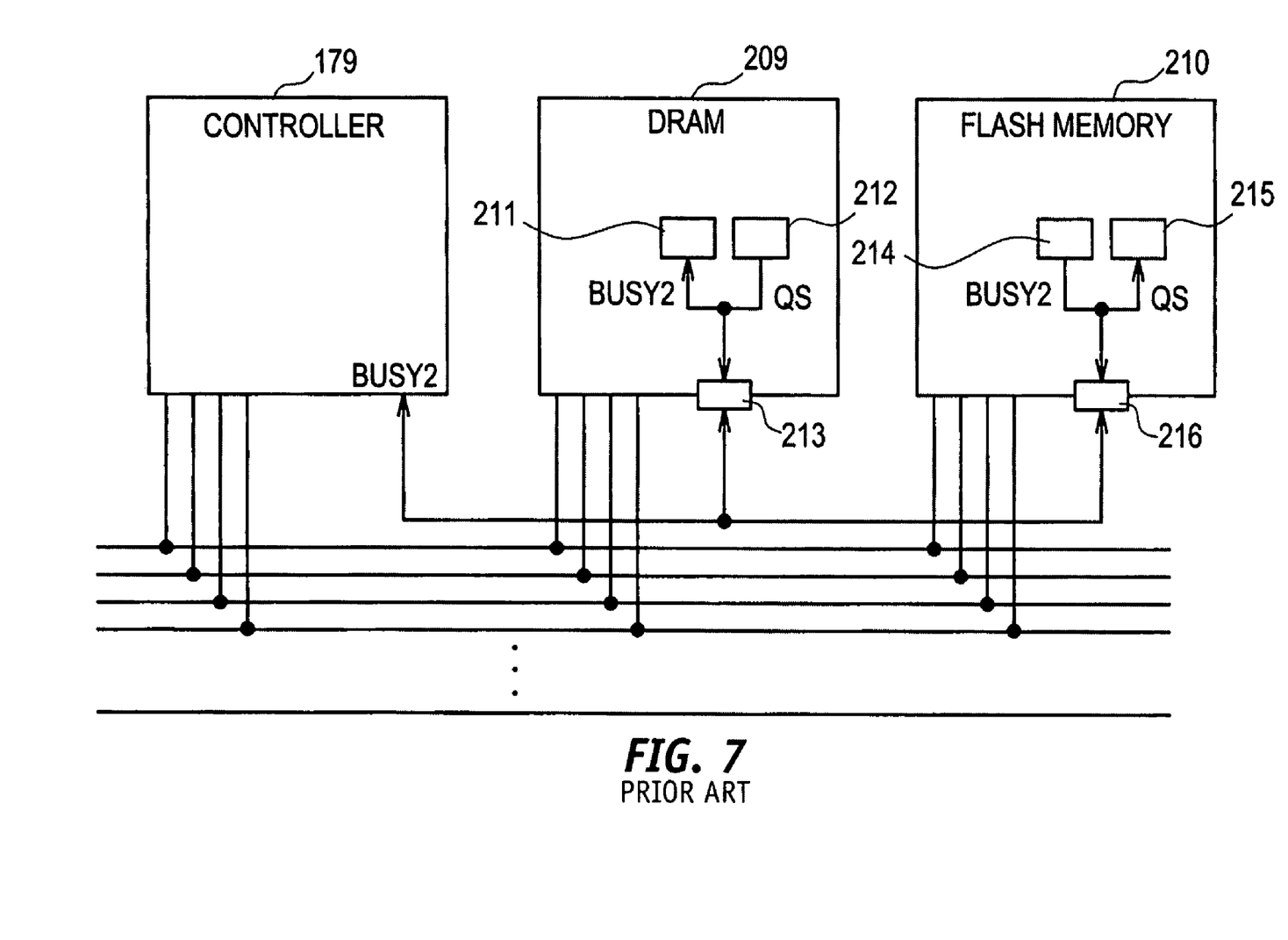
FIG. 7 is a circuit diagram disclosed in Patent Document 2.

Japanese unexamined patent publication No. 2000-353382 ("Patent Document 2") discloses a terminal-sharing technique. With reference to FIG. 7, there is shown a DRAM 209. The DRAM 209 includes therein a BUSY2 input circuit 211 which inputs a busy signal BUSY2 and a QS signal output circuit 212 which outputs a data strobe signal QS. The DRAM 209 is provided with an external terminal 213 which is used both as a busy signal input terminal and a data strobe signal output terminal.

In addition, a flash memory 210 includes therein a BUSY2 output circuit 214 which outputs the busy signal BUSY2 and a QS signal input circuit 215 which inputs the data strobe signal QS. The flash memory 210 is provided with an external terminal 216 which is used both as a busy signal output terminal and a data strobe signal input terminal.

Problems to be Solved by the Invention

For the case of a memory device capable of operating selectively in SDR mode or in DDR mode, it is required that both a RDY terminal and a DQS terminal should be provided. With respect to required signals (input signals and/or output signals), the number of terminals that can be provided for the memory device is limited. If RDY and DQS terminals are dedicated terminals, this sets a limit on the total number of terminals, thereby casuing problems.

Patent Document 2 discloses a terminal-sharing technique, but it is an input/output sharing concept in that a single terminal serves both as a terminal for signal output and as a terminal for signal input. Accordingly, the technique of Patent Document 2 is unable to provide solutions to the problem that the present invention intends to solve. Stated another way, the technique of Patent Document 2 does not disclose a technique capable of switching between two or more output signals depending on the memory device operating mode.

Furthermore, there is a design concept for switching between two or more output signals, in which a respective output control section is provided for each output signal and switching between the two or more output signals is made by an operating mode signal. As a result, the number of element devices of the output control section increases and, in addition, it is impossible to ensure optimum frequency performance corresponding to the aforesaid high DDR operating frequency.

SUMMARY OF THE INVENTION

Means for Solving the Problems

With the above-described prior art techniques in mind, the present invention was made with a view to providing a memory device operable in two modes, i.e., in SDR and DDR modes. Accordingly, an object of the present invention is to provide a memory device capable of outputting, at a shared terminal, a signal of one type which provides information about the state of data outputted in SDR mode and a signal of another type which provides information about the state of data outputted in DDR mode at a proper output timing relative to the outputting of data, without operational delays caused by switching between the modes and characteristic value limitations, and to provide a method of controlling such a memory device.

A memory device, in accordance with the present invention, made to achieve the above object is operable in a first operation mode for setting one edge of an external clock signal as a data determining edge and a second operation mode for setting both edges of the external clock signal as the data determining edge, the memory device comprising a data condition informing terminal which provides a condition of data to be outputted and a data condition signal control section which generates a first signal indicating a logical level transitioning at a first time preceding an initial data determining edge at a start of data output in the first operation mode and a second signal indicating a logical level is toggled every first time preceding each data determining edge on and after the start of data output in the second operation mode, wherein the data condition signal control section outputs the first or second signal to the data condition informing terminal.

In a first operating mode of a memory device in accordance with the present invention, at a first time prior to an initial data determining edge at data output start time, a first signal which makes a logic level transition is outputted at a data condition informing terminal. On the other hand, in a second operating mode of the memory device in accordance with the present invention, at every first time prior to a respective data determining edge after the start of data output, a second signal the logic level of which toggles is outputted at the data condition informing terminal. Depending on the operating mode, the data condition signal control section generates the first or second signal as a signal which provides information about the condition of data to be outputted.

Further, a control method in a memory device in accordance with the present invention is operable in a first operation mode for setting one edge of an external clock signal as a data determining edge and a second operation mode for setting both edges of the external clock signal as the data determining edge, the control method comprising the steps of generating a first signal having a logical level which transits at a first time preceding an initial data determining edge at the start of data output in the first operation mode, generating a second signal having a logical level which is toggled every first time preceding each data determining edge on and after the start of data output in the second operation mode, and outputting one of the first and second signals from a data condition informing terminal by selecting one of the first signal generating step and the second signal generating step.

In a memory device control method in accordance with the present invention, either a first step of generating a first signal which makes a logic level transition at a first time prior to an initial data determining edge in a first operating mode or a second step of generating a second signal the logic level of which toggles at every first time prior to a respective data determining edge after the start of data output in a second operating mode is selected at a second time prior to the first time. Then, depending on which of the first and second steps is selected, the first signal or the second signal is outputted at a data condition informing terminal.

To sum up, depending on the operating modes, either the first signal or the second signal is selected as a signal which provides information on the state of data to be outputted at the first time prior to the data determining edge. And, the first signal or the second signal, whichever is selected, is outputted at the data condition informing terminal. As a result of such arrangement, either one of the first and second signals in the first and second operating modes with different contents is selectively outputted at the same data condition informing terminal depending on the operating modes, thereby eliminating the need to provide different dedicated terminals for each operating mode. It becomes possible to prevent the increase in the number of terminals.

In addition, it is possible to establish switching between the first signal and the second signal depending on the operating modes at the first time prior to the data determining edge at which data is outputted. It is possible to output, as an output of a signal from the data condition informing terminal which provides information about the state of output data, a signal corresponding to the output data at the data condition informing terminal at a proper timing without delays with respect the data determining edge.

EFFECTS OF THE INVENTION

Memory devices and control methods in memory device in accordance with the present invention provide the following effects: a memory device in accordance with the present invention, which is provided with two different operating modes (i.e., first and second operating modes) and which is operable selectively in the first operating mode or in the second operating mode, makes it possible to output a first signal indicative of the state of output data in the first mode or a second signal indicative of the state of output data in the second mode at the data condition informing terminal without operational delays due to switching between the modes and characteristic value limitations and without delays with respect to the timing of outputting data.

DETAILED DESCRIPTION

Hereinafter, embodiments of a memory device and its control method in accordance with the present invention will be described in detail with reference to the drawing figures (FIGS. 1 through 6).

Non volatile memory devices (such as flash memory) and volatile memory devices (such as DRAM and SRAM) include so-called synchronous memory devices. Such a synchronous memory device is operation-specified such that it performs a data reading-out operation in synchronization with an external clock signal. In a typical synchronous memory device, data items at different addresses are read out sequentially for each clock signal cycle in the steady state. Here, the external clock signal is generally fast, so that in order to make it possible to achieve a data reading-out operation for each cycle with respect to the fast clock signal cycle, it is required that internal preprocessing of data to be read out (e.g., the amplification of data items from a plurality of memory cells) should be completed at the start of a reading-out operation.

An initial latency (L) after the start is set as the time required for conducting the above preprocessing. Generally the initial latency (L) is set by a number of cycles of an external clock signal after the issue of an activation directive (AVD) for the taking-in of an external address. It is required that internal preprocessing of data to be read out is completed by the time that an external clock signal with a number of cycles set as the initial latency (L) has elapsed, and that data output is fixed at the time that the initial latency (L) is completed. If a data valid flag, which provides to a device external to the memory device a piece of information that the internal preprocessing of data has been completed, is outputted, this enables the external controller to verify that a data item being outputted is effective, in combination with counting the number of cycles of an external clock signal or instead of counting the number of cycles of an external clock signal. The data valid flag is a flag which is required in the case where a controller of the type that receives data from a synchronous memory device does not count the number of clocks of an external clock signal.

Here, the data valid flag is a ready signal RDY for a non volatile memory device such as a flash memory device. The controller monitors the logic level of the ready signal RDY and decides whether data DQ which is outputted at a data terminal (DQ) is effective or not. In the count period of the initial latency (L), the ready signal RDY is outputted between the (L-1)th clock signal cycle and the Lth clock signal cycle. The ready signal RDY is outputted in the single data rate (SDR) mode, providing information about the effectiveness of the data DQ at either one of the edges of the external clock signal. Here, the SDR mode is an example of a first mode.

In the double data rate (DDR) mode in which both edges of a fast external clock signal serve as data determining edges, the frequency, at which the transferring of data from the data terminal (DQ) is conducted, is double relative to the SDR mode. This means that the outputting of data has to be completed within a short period of time, i.e., half the cycle of an external clock signal CLK. Furthermore, even with consideration of such an arrangement that a synchronous memory device and a controller are mounted on the same mounting substrate, it is inevitable that the length of wiring for establishing connection between the synchronous memory device and the controller will be very long. As a result, the occurrence of skewing of the external clock signal CLK and propagation skewing of the data DQ becomes unavoidable. These circumstances give rise to the possibility that even in the case where the level of signal skew is considerably slight, deviation of synchronization caused by transition timing deviation may take place. This further gives rise to the possibility that the original data DQ may not be transferred at the original timing. To cope with this, in the DDR mode, a strobe signal DQS which makes a transition in synchronization with the transition timing of the data DQ is outputted, being indicative of the timing of acquisition of the data DQ by the controller. Here, the DDR mode is an example of a second operating mode.

Figure 1:
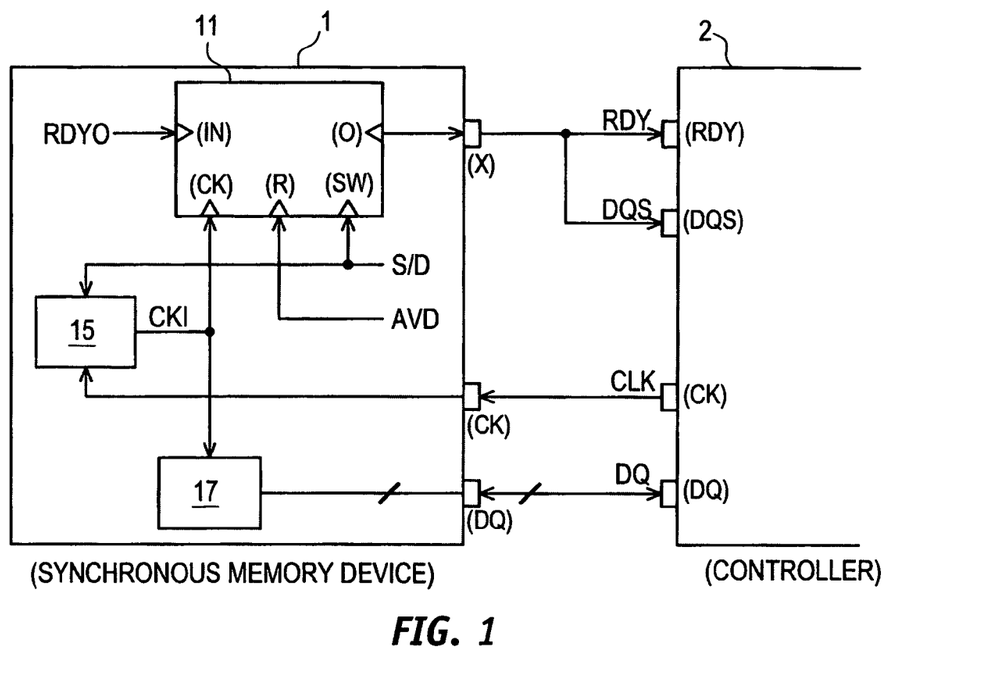
FIG. 1 is a circuit block diagram showing a circuit configuration at the time of data transfer to a controller from a memory device in accordance with an embodiment of the present invention.

With reference to FIG. 1, there is shown a circuit block diagram of a circuit configuration at the time of the transfer of data from a synchronous memory device 1 to a controller 2. In the SDR mode, a ready signal RDY as a specific example of the data valid flag is outputted at a data condition informing terminal (X) of the synchronous memory device 1 while in the DDR mode, a strobe signal DQS is outputted at the data condition informing terminal (X). The controller 2 is provided with separate dedicated terminals, namely a ready terminal (RDY) to which the ready signal RDY is applied and a strobe terminal (DQS) to which the strobe signal DQS is applied. Stated another way, it is arranged that the signals are applied, respectively, to the terminals corresponding to the respective operating modes. The ready signal RDY is an example of a first signal. The strobe signal DQS is an example of a second signal.

An external clock signal CLK outputted from a clock signal terminal (CK) of the controller 2 is provided to a clock signal terminal (CK) of the synchronous memory device 1. The external clock signal CLK fed to the synchronous memory device 1 is sent to an internal clock signal generator 15. The internal clock signal generator 15 is also fed an operating mode signal S/D which differentiates between the SDR mode and the DDR mode. The oscillating frequency of an internal clock signal CKI to be outputted is set in response to the operating mode signal S/D. In the SDR mode (S/D=Hi), the oscillating frequency of the internal clock signal CKI is the same as that of the external clock signal CLK and in synchronization therewith. On the other hand, in the DDR mode (S/D=Lo), the oscillating frequency of the internal clock signal CKI is twice that of the external clock signal CLK, while also being in synchronization therewith.

The internal clock signal CKI is provided to a data condition signal control section 11 and into a data output control circuit 17. The data output control circuit 17 outputs, through the data terminal (DQ), the data DQ in response to the internal clock signal CKI. The controller 2 takes in the data DQ from the data terminal (DQ) in response to the external clock signal CLK and the ready signal RDY or the strobe signal DQS.

The data condition signal control section 11 is provided, at its reset terminal (R), an activation signal AVD, an initialization operation being carried out in response to a high-level pulse of AVD. In addition, inputted at a switching terminal (SW) of the data condition signal control section 11 is the operating mode signal S/D. Depending on the SDR/DDR mode, the ready signal RDY/strobe signal DQS is outputted at an output terminal (O) of the data condition signal control section 11. The output terminal (O) is connected to the data condition informing terminal (X). Depending on the operating mode, the ready signal RDY or the strobe signal DQS is outputted at the data condition informing terminal (X). Additionally, applied to an input terminal (IN) of the data condition signal control section 11 is a data condition prior-determination signal RDYO. The data condition prior-determination signal RDYO is a signal which is outputted by a control circuit (not shown) and whose logic level makes a transition depending on the count of the initial latency and/or on the internal processing of data to be read out from a memory cell.

In the data condition signal control section 11, in the SDR mode, with respect to the operating mode signal S/D of high level, a transition of the logic level of the data condition prior-determination signal RDYO is outputted to the output terminal (O) in response to the internal clock signal CKI. The ready signal RDY is outputted in synchronization with the internal clock signal CKI following the logic level transition of the data condition prior-determination signal RDYO. On the other hand, in the DDR mode, with respect to the operating mode signal S/D of low level, a toggle signal is outputted to the output terminal (O) in response to the internal clock signal CKI following the logic level transition of the data condition prior-determination signal RDYO. After the internal clock signal CKI following the logic level transition of the data condition prior-determination signal RDYO, the strobe signal DQS is outputted in synchronization with the internal clock signal CKI.

Figure 2:
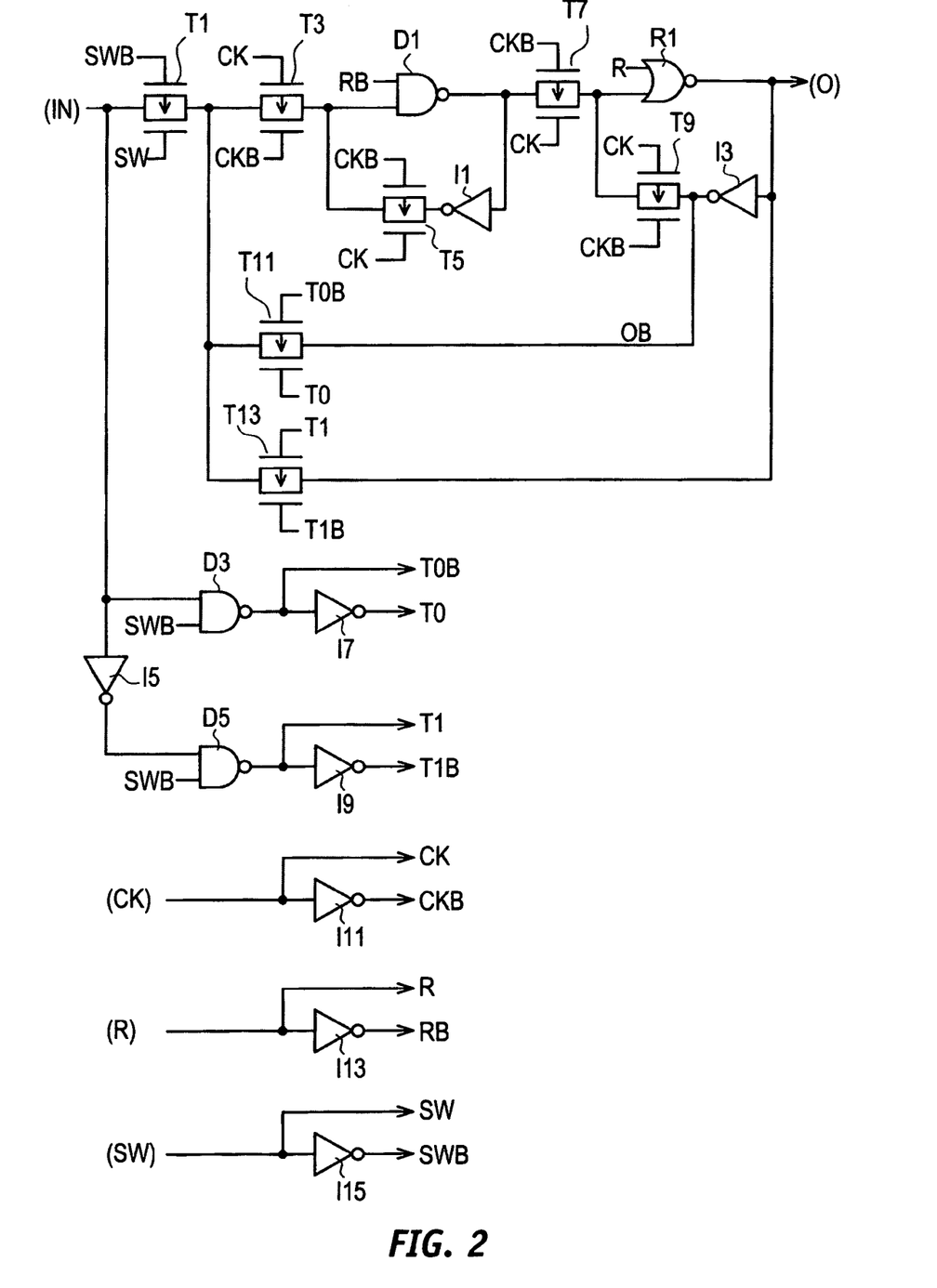
FIG. 2 is a circuit diagram showing a data condition signal control section in accordance with the embodiment of FIG. 1.

With reference to FIG. 2, there is shown a specific example of a circuit configuration of the data condition signal control section 11 in accordance with an embodiment of the present invention. An input terminal (IN) of the data condition signal control section 11 is connected to one terminal of a transfer gate T1, to one of two input terminals of a NAND gate D3, and to an input terminal of an inverter gate I5. The transfer gate T1 and all of other transfer gates T3, T5, T7, T9, T11 and T13 (later described) are each composed of a single PMOS/NMOS transistor pair. A gate of the NMOS transistor of the transfer gate T1 is connected to the switching terminal (SW) (node SW) while, on the other hand, a gate of the PMOS transistor of the transfer gate T1 is connected to an output terminal of an inverter gate I15 connected to the switching terminal (SW) (node SWB).

The other terminal of the transfer gate T1 is connected to one terminal of each of the transfer gates T3, T11 and T13. A gate of the PMOS transistor of the transfer gate T3 is connected to the clock signal terminal (CK) (node CK) while a gate of the NMOS transistor of the transfer gate T3 is connected to an output terminal of an inverter gate I11 connected to the clock signal terminal (CK) (node CKB). The other terminal of the transfer gate T3 is connected to one of two input terminals of a NAND gate D1 and to one terminal of the transfer gate T5.

A gate of the PMOS transistor of the transfer gate T11 is connected to an output terminal (node T0B) of the NAND gate D3 while a gate of the NMOS transistor of the transfer gate T11 is connected to an output terminal (node T0) of an inverter gate I7 connected to the node T0B. The other input terminal of the NAND gate D3 is connected to the node SWB. The other terminal of the transfer gate T11 is connected to an output terminal (node OB) of an inverter gate I3.

A gate of the PMOS transistor of the transfer gate T13 is connected to an output terminal (node T1) of a NAND gate D5 while a gate of the NMOS transistor of the transfer gate T13 is connected to an output terminal (node T1B) of an inverter gate I9 connected to the node T1. One of two input terminals of the NAND gate D5 is connected to an output terminal of the inverter gate I5 while the other input terminal of the NAND gate D5 is connected to the node SWB. The other terminal of the transfer gate T13 is connected to the output terminal (O).

Connected to the other input terminal of the NAND gate D1 is an output terminal of an inverter gate I13 whose input terminal is connected to the reset terminal (R) (node R). An output terminal of the NAND gate D1 is connected to one terminal of the transfer gate T7 and to an input terminal of the inverter gate I1. An output terminal of the inverter gate I1 is connected to the other terminal of the transfer gate T5. In addition, a gate of the PMOS transistor of the transfer gate T5 is connected to the node CKB while a gate of the NMOS transistor of the transfer gate T5 is connected to the node CK.

A gate of the PMOS transistor of the transfer gate T7 is connected to the node CKB while a gate of the NMOS transistor of the transfer gate T7 is connected to the node CK. The other terminal of the transfer gate T7 is connected to one of two input terminals of a NOR gate R1 and to one terminal of the transfer gate T9. Connected to the other input terminal of the NOR gate R1 is the node R. An output terminal of the NOR gate R1 is connected to the output terminal (O) (node O) as well as to an input terminal of the inverter gate I3. The output terminal (node OB) of the inverter gate I3 is connected to the other terminal of the transfer gate T9. The node OB is a node to which an inverse signal of the output terminal (O) is outputted.

The NAND gate D1 and the inverter gate I1 together constitute a latch circuit when the transfer gate T5 conducts. Likewise, the NOR gate R1 and the inverter gate I3 together constitute a latch circuit when the transfer gate T9 conducts.

The transfer gate T3 and the transfer gate T9, and the transfer gate T5 and the transfer gate T7 are continuity-controlled by signals in inverted relationship with respect to each other. Stated another way, when the node CK is logic low and the node CKB is logic high, the transfer gate T3 and the transfer gate T9 become conductive while, simultaneously, the transfer gate T5 and the transfer gate T7 become nonconductive. On the other hand, when the node CK is logic high and the node CKB is logic low, the transfer gate T5 and the transfer gate T7 become conductive while, simultaneously, the transfer gate T3 and the transfer gate T9 become nonconductive.

In this manner, in response to one cycle of the internal clock signal CKI which is applied to the clock signal terminal (CK), data applied to the one terminal of the transfer gate T3 is outputted at the output terminal (O). A shift register section is constituted by two latch circuits which are formed with the transfer gate T7 sandwiched therebetween, from the transfer gate T3. Here, the one terminal of the transfer gate T3 serving as a connection point between the transfer gate T1 and the transfer gate T3 corresponds to a first node.

The transfer gate T1 becomes conductive when the node SW is logic high and the node SWB is logic low. On the other hand, the transfer gate T1 becomes nonconductive when the node SW is logic low and the node SWB is logic high.

When the operating mode signal S/D which is applied to the switching terminal (SW) is logic high thereby indicating the SDR mode, the data condition prior-determination signal RDYO which is applied to the input terminal (IN) is entered into the shift register section. At this time, the NAND gates D3 and D5 are each fed an inverse signal of the operating mode signal S/D. Because of the application of such a low-level signal to the NAND gates D3 and D5, their output terminals are fixed at a logic high. Both the transfer gates T11 and T13 enter the nonconductive state. Paths returning to the first node (the one terminal of the transfer gate T3) are disconnected from the node (O) and the node (OB) because the transfer gates T13 and T11 are being in the nonconductive state. Consequently, the data condition prior-determination signal RDYO is outputted at the output terminal (O) after an elapse of one cycle of the internal clock signal CKI. This signal serves as the ready signal RDY.

The transfer gate T1 and the inverter gate I15, or the transfer gate T1, the inverter gate I15, and the control circuit which outputs the data condition prior-determination signal RDYO are an example of a first control part, wherein the transfer gate T1 is an example of a first switch part.

In addition, when the operating mode signal S/D which is applied to the switching terminal (SW) is logic low thereby indicating the DDR mode, the transfer gate T1 is in the nonconductive state, and the data condition prior-determination signal RDYO which is applied to the input terminal (IN) will not be entered into the shift register section. Meanwhile, an inverse signal of the operating mode signal S/D which is entered into the NAND gates D3 and D5 becomes logic high. An in-phase signal and an inverse signal of the data condition prior-determination signal RDYO are entered, respectively, into the NAND gate D3 and the NAND gate D5 so that they are outputted in a logically inverted manner.

Accordingly, depending on the logical level of the data condition prior-determination signal RDYO, either one of the output terminals of the NAND gates D3 or D5 becomes logic high while the other output terminal becomes logic low. Suppose here that the control circuit (not shown) causes the data condition prior-determination signal RDYO to make a transition to logic high in response to the external clock signal CLK preceding ahead by two edges (FIG. 4) or one edge (FIG. 6) of the clock signal edges for the counting of the initial latency. In response to completion of the internal preprocessing of data to be read out, the data condition prior-determination signal RDYO makes a transition to logic high.

During the period in which the internal preprocessing of data to be read out is still in progress, the data condition prior-determination signal RDYO is a logic low. The output terminal of the NAND gates D3 and D5 are a logic high and a logic low, respectively, and the transfer gates T11 and T13 become nonconductive and conductive, respectively. The first node (i.e., the one terminal of the transfer gate T3) is connected to the node O, and the logic level of the node O is held in an initialization state. This initialization state is a logic level initialized by the reset terminal (R). By the activation signal AVD (which is applied to the reset terminal (R)) becoming a pulse signal of logic high, the node O is initialized to logic low. During the period in which the data condition prior-determination signal RDYO is logic low, the output terminal (O) is fixed to be logic low.

Upon completion of the internal preprocessing of data to be read out, the data condition prior-determination signal RDYO becomes logic high. The output terminal of the NAND gates D3 and D5 is inverted so as to be logic low and logic high, respectively, and the transfer gates T11 and T13 are inverted so as to become respectively conductive and nonconductive. The first node (i.e., the one terminal of the transfer gate T3) is connected to the node OB. The node OB is a node which outputs an inverse logic level of the output terminal (O) (node O). Thus, a toggle signal, the logic level of which is inverted for every clock signal cycle of the internal clock signal CKI, is outputted at the output terminal (O). An output signal from the output terminal (O) becomes the strobe signal DQS in synchronization with the outputting of the data DQ.

The transfer gate T11, the NAND gate D3, the inverter gate I7, and the inverter gate I15 are an example of a second control section. In addition, the transfer gate T11 is an example of a second switch section and the inverter gate I3 is an example of a logic inversion section. Furthermore, the transfer gate T13 is an example of a third switch section.

Depending on the operating mode, an adequate circuit configuration for the data condition signal control section 11 is set, and the ready signal RDY (in the SDR mode) or the strobe signal DQS (in the DDR mode) is outputted at the data condition informing terminal (X).

FIGS. 3 and 5, and FIGS. 4 and 6 illustrate setting states of the data condition signal control section 11 and operational waveforms, respectively, in accordance with the two operating modes.

Figure 3:
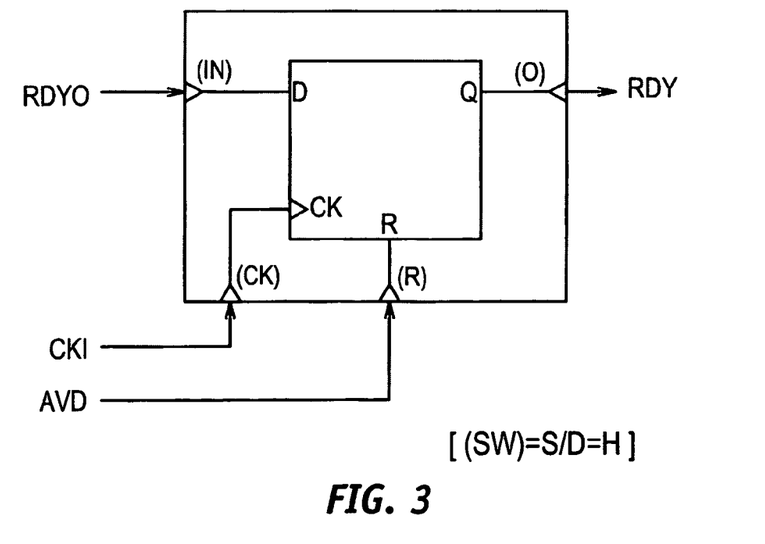
FIG. 3 is a diagram showing a setting state of the data condition signal control section in SDR mode in accordance with the embodiment of FIG. 1.
Figure 4:
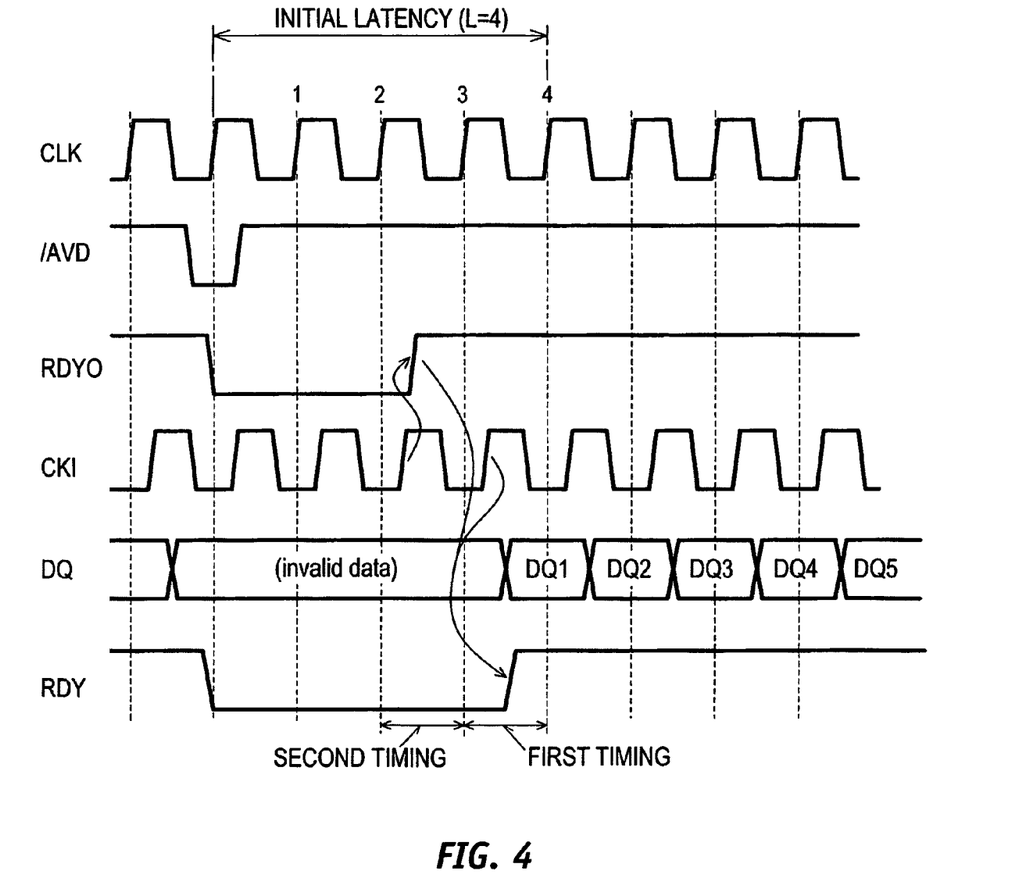
FIG. 4 is a diagram illustrating operational waveforms by the data condition signal control section in SDR mode in accordance with the embodiment of FIG. 1.

FIGS. 3 and 4 are exemplary of the case where the SDR mode is set as the operating mode. In the SDR mode, in response to the transition of the operating mode signal S/D to logic high, a D flip-flop circuit is formed. The input terminal (IN) is a D terminal. The output terminal (O) is a Q terminal. For each internal clock signal CKI which is applied to the clock signal terminal (CK), the logic level of the data condition prior-determination signal RDYO which is applied to the input terminal (IN) is transferred to the output terminal (O).

As shown in FIG. 4, at the point of time when the internal processing of data to be read out is completed while the initial latency (L=4) still continues (after an elapse of two cycles of the external clock signal CLK), the control circuit (not shown) causes the data condition prior-determination signal RDYO to make a transition to logic high. In this case, in synchronization with the internal clock signal CKI, the data condition prior-determination signal RDYO makes a transition to logic high at the cycle (the external clock signal CLK during the third cycle) occurring one cycle ahead relative to the final clock signal (the external clock signal CLK during the fourth cycle) at which the initial latency is completed. This timing is an example of a second timing. This logic level transition is transferred to the output terminal (O) in synchronization with the internal clock signal CKI during the next cycle. This is an example of a first timing. The ready signal RDY is outputted at the output terminal (O). The ready signal RDY is an example of a first signal.

As a result, in the final clock signal cycle (i.e., the external clock signal CLK at the fourth cycle) at which the initial latency is completed, the effectiveness indicating flag RDY of logic high is outputted at the output terminal (O). Thereafter, the state of logic high continues, thereby informing that the data DQ which is outputted in response to the termination of the count period of the initial latency is effective.

Figure 5:
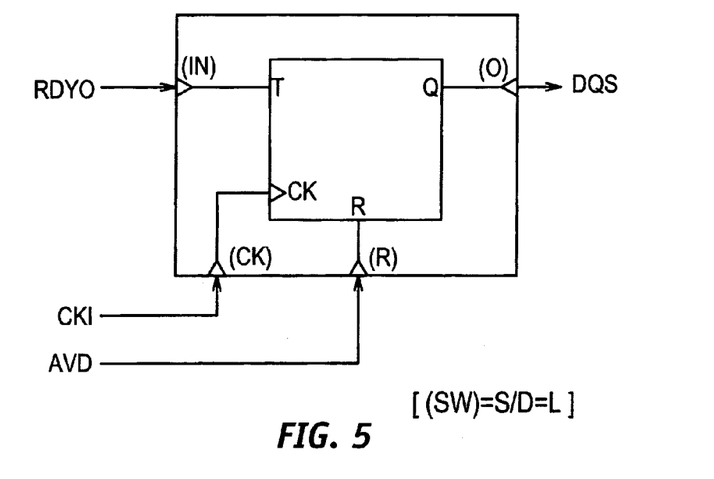
FIG. 5 is a diagram showing a setting state of the data condition signal control section in DDR mode in accordance with the embodiment of FIG. 1.
Figure 6:
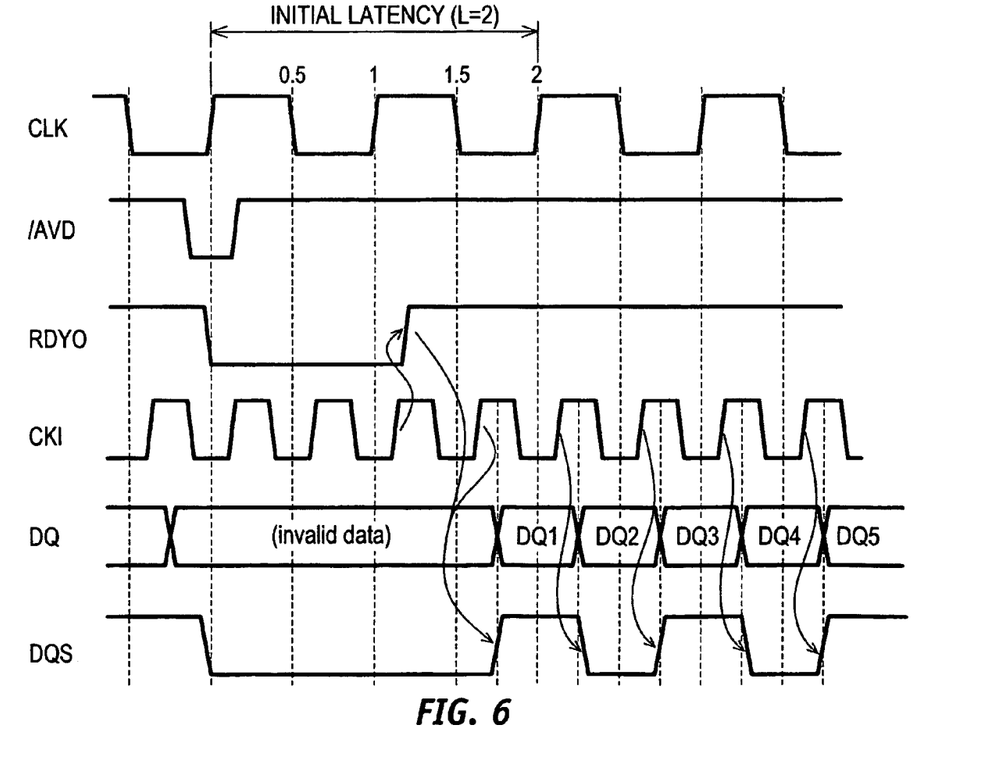
FIG. 6 is a diagram illustrating operational waveforms by the data condition signal control section in DDR mode in accordance with the embodiment of FIG. 1.

FIGS. 5 and 6 are exemplary of the case where the DDR mode is set as the operating mode. In the DDR mode, in response to the transition of the operating mode signal S/D to logic low, a T flip-flop circuit is formed. The input terminal (IN) is a T terminal. The output terminal (O) is a Q terminal. For each internal clock signal CKI which is applied to the clock signal terminal (CK), a toggle signal is outputted at the output terminal (O) if the logic level of the data condition prior-determination signal RDYO which is applied to the input terminal (IN) is logic high. In addition, when the data condition prior-determination signal RDYO is logic low, the logic level of the output terminal (O) is fixed.

As shown in FIG. 6, during the period in which the initial latency (L=2) still continues and the internal preprocessing of data to be read out is still in progress, the data condition prior-determination signal RDYO is held logic low by the control circuit (not shown). In the T flip-flop circuit (FIG. 5), the output terminal (O) outputs a signal the logic level of which is fixed. In response to application of the activation signal AVD of logic high to the reset terminal (R) at the start of the initial latency, the output terminal (O) is fixed at logic low.

The data condition prior-determination signal RDYO makes a transition to logic high in synchronization with the internal clock signal CKI in a first half of the final clock signal cycle at which the initial latency is completed (i.e., during a logic-high period of the external clock signal CLK during the second cycle). This timing is an example of a second timing. As a result of this, the T flip-flop circuit is set to output a toggle signal from the next cycle of the internal clock signal CKI which is a logic-low period of the external clock signal CLK during the second cycle. In a second half of the final clock signal cycle at which the initial latency is completed (i.e., during a logic-low period of the external clock signal CLK durign the second cycle), the logic level of the output terminal (O) is inverted to logic high in synchronization with the internal clock signal CKI. This timing is an example of a first timing. Thereafter, a toggle signal the logic level of which is inverted for every clock signal cycle of the internal clock signal CKI is outputted, in other words the strobe signal DQS as a signal the logic level of which is inverted in synchronization with the internal clock signal CKI is outputted at the output terminal (O) for every first timing. The strobe signal DQS is an example of a second signal.

In addition, when employing a design means by which the data DQ to be read out is updated in response only to the internal processing of data to be read out from memory cells, the timing of outputting data DQ1 which is a data item to be outputted first may be any time prior to the initial latency. In other words, the time at which switching between undetermined data (invalid data) and the data DQ1 takes place (FIG. 6) is within the count period (from latency 0 to latency 1) of the initial latency. The strobe signal DQS invariably makes a transition in response to the rising edge of the internal clock signal CKI during the period from latency 1.5 to latency 2. Therefore, the edge of the strobe signal DQS becomes asynchronous in timing relative to the edge of the data DQ1.

Thus, FIG. 6 depicts the case where the time at which switching between undetermined data and the data DQ1 takes place makes a transition in response to the rising edge of the internal clock signal CKI during the period from latency 1.5 to latency 2.

As a result, in the DDR mode with a fast data transfer rate, the strobe signal DQS is outputted in synchronization with the transition of data, thereby ensuring the taking-in of data by the controller 2.

Therefore, it is possible in accordance with the present invention to selectively output the ready signal RDY which is outputted in the SDR mode or the strobe signal DQS which is outputted in the DDR mode at the data condition informing terminal (X) which is a shared terminal, depending on the operating modes. In a synchronous memory device able to operate selectively in the SDR mode or in the DDR mode, it becomes possible to allow a single terminal to be shared between different operating modes, thereby making it possible to prevent an increase in the number of terminals.

In addition, there is disclosed a design concept for switching between two or more output signals, which realizes both the function of a D flip-flop circuit and the function of a T flip-flop circuit by the use of a minimum number of element devices in the data condition signal control section 11, without the provision of output control sections for the output signals. Consequently, it becomes possible to prevent the increase in die size and to obtain optimum frequency performance corresponding to the fast DDR operating frequency.

As has been described in detail, in accordance with the present embodiment, signals with different content for each operating mode are outputted at the same terminal (i.e., the data condition informing terminal (X)) depending on the operating modes. This eliminates the need for the provision of different types of dedicated terminals for each operating mode, thereby preventing an increase in the number of terminals.

In addition, switching of data to be outputted to the data condition informing terminal (X) depending on the operating modes may be accomplished in synchronization with a data determining edge prior to a data determining edge where data is outputted. Thus, a signal corresponding to the output data may be outputted at the data condition informing terminal (X) with proper timing and without a delay between the outputting of a signal at the data condition informing terminal (X) which provides information about the state of output data and the actual outputting of data.

The present invention is not limited to the foregoing embodiment and various improvements and modifications may be made in the present invention without departing from the sprit and scope thereof.

For example, the present invention has been described in terms of a case where switching between the ready signal RDY and the strobe signal DQS is accomplished depending on the operating modes (SDR and DDR modes), for output at the data condition informing terminal (X) which is a shared terminal. It is to be understood that the present invention is not limited to such a case. If configured such that the propagation path of a signal which is applied to the first node (i.e., the one terminal of the transfer gate T3 of the data condition signal control section 11) is switched depending on the predetermined operating conditions, this makes it possible to adequately combine and switch, depending on the differences in operating conditions, signals of predetermined logic level and/or predetermined toggle signals, for output at the same terminal. In this case, the difference in operating conditions is not necessarily limited to two types. If, associated with each of three or more types of operating modes, connection is switched, this makes it possible to allow signals for each operating mode to be outputted at a shared terminal.

What is claimed is:

1. A memory device which is operable in a first operation mode for setting one edge of an external clock signal as a data determining edge and a second operation mode for setting both edges of the external clock signal as the data determining edge, the memory device comprising:

a data condition informing terminal which provides a condition of data to be outputted; and a data condition signal control section which generates a first signal indicating a logical level transitioning at a first time preceding an initial data determining edge at a start of data output in the first operation mode and a second signal indicating a logical level is toggled every first time preceding each data determining edge on and after the start of data output in the second operation mode, and wherein the data condition signal control section outputs the first or second signal to the data condition informing terminal.

2. The memory device according to claim 1, wherein the first time is a time between a data determining edge in which the first or second signal is determined and a preceding data determining edge thereto.

3. The memory device according to claim 2, wherein the first time is a time synchronized with the preceding data determining edge.

4. The memory device according to claim 1, wherein a data transition time at which data transits in logic level prior to the data determining edge in the second operation mode is a time synchronized with transition of the second signal.

5. The memory device according to claim 4, wherein a time to output initial data among the data transition times is a time different from a time at which the second signal is toggled.

6. The memory device according to claim 1, wherein the first signal is a data valid flag to inform that data to be outputted is valid and the second signal is a strobe signal representing the data to be outputted.

7. The memory device according to claim 1, wherein the data condition signal control section comprises:
a shift resistor section which transmits a signal indicating a condition of a first node to the data condition informing terminal at the first time;
a first control section which sets the first node to the logical level generated as the first signal at a second time preceding the first time in the first operation mode; and
a second control section which sets the first node to an inversion signal of a signal from the data condition informing terminal at a second time preceding the first time in the second operation mode.

8. The memory device according to claim 7, wherein the second time is a time between a preceding data determining edge prior to the first time and an earlier preceding data determining edge earlier than the preceding data determining edge.

9. The memory device according to claim 8, wherein the second time is a time synchronized with the earlier preceding data determining edge.

10. The memory device according to claim 7 further comprising an internal clock generator generating an internal clock signal synchronized with the data determining edge,
wherein the first and second times are times synchronized with the internal clock signal.

11. The memory device according to claim 7, wherein the first control section including a first switch portion having a first terminal to be connected to the first node and a second terminal in which a signal of the logical level to be generated as the first signal is inputted.

12. The memory device according to claim 11, wherein the first switch section is activated in the first operation mode, and
the signal of the logical level is inputted to the second terminal of the first switch section by a time corresponding to the second time after the preceding data determining edge prior to the second time.

13. The memory device according to claim 11, wherein the first switch section is activated by a time corresponding to the second time after the preceding data determining edge prior to the second time.

14. The memory device according to claim 7, wherein the second control section comprises:

a second switch section having a first terminal to be connected to the first node;
a logical inverting section having an input terminal connected to the data condition informing terminal and an output terminal connected to a second terminal of the second switch section.

15. The memory device according to claim 14, wherein the second switch section is activated by a time corresponding to the second time after the preceding data determining edge prior to the second time.

16. The memory device according to claim 14, wherein
the second control section further comprises a third switch section having a first terminal connected to the first node and a second terminal connected to the data condition informing terminal, and wherein
the second control section is activated until a time corresponding to the preceding data determining edge prior to the second time in the second operation mode.

17. A control method in a memory device which is operable in a first operation mode for setting one edge of an external clock signal as a data determining edge and a second operation mode for setting both edges of the external clock signal as the data determining edge, the control method comprising the steps of:
generating a first signal having a logical level which transits at a first time preceding an initial data determining edge at the start of data output in the first operation mode;
generating a second signal having a logical level which is toggled every first time preceding each data determining edge on and after the start of data output in the second operation mode; and
outputting one of the first and second signals from a data condition informing terminal by selecting one of the first signal generating step and the second signal generating step.

18. The control method in a memory device according to claim 17, wherein the first time is a time between the data determining edge in which the first or second signal is determined and the preceding data determining edge.

19. The control method in a memory device according to claim 18, wherein the first time is a time synchronized with the preceding data determining edge.

20. The control method in a memory device according to claim 17, wherein the first signal is a data valid flag to inform that data to be outputted is valid and the second signal is a strobe signal representing the data to be outputted.

21. The control method in a memory device according to claim 17, wherein the first and second signal generating steps and the outputting step include:
a step of transmitting a signal at the first time to the data condition informing terminal:
a step of setting the signal to be transmitted at a logical level to be outputted as the first signal at a second time preceding the first time in the first operation mode; and
a step of setting the signal to be transmitted as an inversion signal of a signal from the data condition informing terminal at a second time preceding the first time in the second operation mode.

22. The control method in a memory device according to claim 21, wherein the second time is a time between the preceding data determining edge prior to the first time and an earlier preceding data determining edge earlier than the preceding data determining edge.

23. The control method in a memory device according to claim 22, wherein the second time is a time synchronized with the earlier preceding data determining edge.

24. The control method in a memory device according to claim 21 further comprising an internal clock signal synchronized with the data determining edge,
wherein the first and second times are times synchronized with the internal clock signal.

* * * * *